US010952314B2

(12) United States Patent
Chocteau et al.

(10) Patent No.: US 10,952,314 B2
(45) Date of Patent: Mar. 16, 2021

(54) REMOVAL OF HIGH STRESS ZONES IN ELECTRONIC ASSEMBLIES (71) Applicant: SAFRAN ELECTRONICS & DEFENSE, Boulogne-Billancourt (FR)

(72) Inventors: Philippe Chocteau, Boulogne-Billancourt (FR); Denis Lecordier, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 16/955,288

(22) PCT Filed: Dec. 3, 2018

(86) PCT No.: PCT/EP2018/083369
§ 371 (c)(1),
(2) Date: Jun. 18, 2020

(87) PCT Pub. No.: WO2019/120969
PCT Pub. Date: Jun. 27, 2019

(65) Prior Publication Data
US 2020/0404777 A1    Dec. 24, 2020

(30) Foreign Application Priority Data

Dec. 19, 2017 (FR) ...................... 1762467

(51) Int. Cl.
*H05K 1/18*     (2006.01)
*H05K 1/02*     (2006.01)
(Continued)

(52) U.S. Cl.
CPC .......... *H05K 1/0271* (2013.01); *H05K 1/111* (2013.01); *H05K 1/181* (2013.01); *H05K 3/303* (2013.01);
(Continued)

(58) Field of Classification Search
CPC .......... H05K 1/18; H05K 1/181; H05K 3/303; H05K 3/341–3442
See application file for complete search history.

(56) References Cited

U.S. PATENT DOCUMENTS 5,569,880 A    10/1996    Galvagni et al.
5,684,677 A    11/1997    Uchida et al.
(Continued)

FOREIGN PATENT DOCUMENTS

JP    2016-178150 A    10/2016

OTHER PUBLICATIONS

International Search Report for PCT/EP2018/083369 dated Feb. 8, 2019 [PCT/ISA/210].
(Continued)

*Primary Examiner* — Jeremy C Norris
(74) *Attorney, Agent, or Firm* — Sughrue Mion, PLLC (57) ABSTRACT The invention relates to an electronic board (1) comprising: —a printed circuit (2) having a connection face (3) defining a plane (X, Y) comprising at least one transfer area (4), —an electronic component (5) comprising at least one contact terminal (6), each contact terminal (6) being brazed or sintered on an associated transfer area (4) by means of a brazing joint or of a sintering joint (7), the electronic board being characterised in that an orthogonal projection of the contact terminal (6) of the electronic component (5) on the connection face (3) of the printed circuit does not overlap the associated area (4).

11 Claims, 5 Drawing Sheets (51) Int. Cl.
    *H05K 1/11*      (2006.01)
    *H05K 3/30*      (2006.01)
(52) U.S. Cl.
    CPC .............. *H05K 2201/068* (2013.01); *H05K 2201/09472* (2013.01); *H05K 2201/10636* (2013.01)

(56)  References Cited

U.S. PATENT DOCUMENTS

2015/0342045 A1*  11/2015  Nakabayashi ......... H05K 1/111
                                                        362/611
    2017/0150605 A1    5/2017  Nagai et al.
    2017/0208689 A1    7/2017  Fukuzumi et al.

OTHER PUBLICATIONS

International Search Report dated Feb. 15, 2019 from the International Searching Authority in International Application No. PCT/EP2018/083369.
French Search Report dated Aug. 27, 2018 from the National Institute of Industrial Property of France in Application No. 1762467.

* cited by examiner

REMOVAL OF HIGH STRESS ZONES IN ELECTRONIC ASSEMBLIES

CROSS REFERENCE TO RELATED APPLICATIONS

This application is a National Stage of International Application No. PCT/EP2018/083369 filed Dec. 3, 2018, claiming priority based on French Patent Application No. 1762467 filed Dec. 19, 2017, the entire contents of each of which are herein incorporated by reference in their entireties.

FIELD OF THE INVENTION

The invention relates to the field of electronic boards, particularly in the automobile, aeronautics and space fields, and more precisely the attachment of surface-mount components to printed circuits.

TECHNICAL BACKGROUND

In a manner known per se, an electronic board can comprise surface-mount components (SMC), i.e. electronic components soldered directly to the surface of the printed circuit of an electronic board.

Customarily, SMC are surface mounted either by reflow soldering, or by wave soldering, or by the use of a conductive adhesive, or by sintering.

In the case of reflow soldering, the bare printed circuit is first screen printed by covering the conductive layers of the printed circuit (generally made of copper) with a solder paste using a screen (or stencil) so that only the locations intended to receive the terminals of the components are covered by the solder paste. The solder paste comprises, in a manner known per se, a metal alloy in suspension in a soldering flux. Then the terminals of the (SMC) components are laid on the solder paste before undergoing a thermal reflow treatment, during which the heat melts the alloy and evaporates the soldering flux so as to form solder joints from the metal alloy present in the solder paste.

In the case of assembly by silver sintering, the bare printed circuit is also screen printed by covering the conductive layers of the printed circuit with a paste by means of a screen (or stencil) so that only the locations intended to receive the terminals of the components are covered by the paste. The paste comprises, in a manner known per se, particles of silver and organic elements serving as binders, dispersers and diluents. Then the terminals of the (SMC) components are positioned on the paste before undergoing a thermal sintering treatment, during which the heat welds the grains together without leading them to melting, thus producing the joint.

Figure 1:
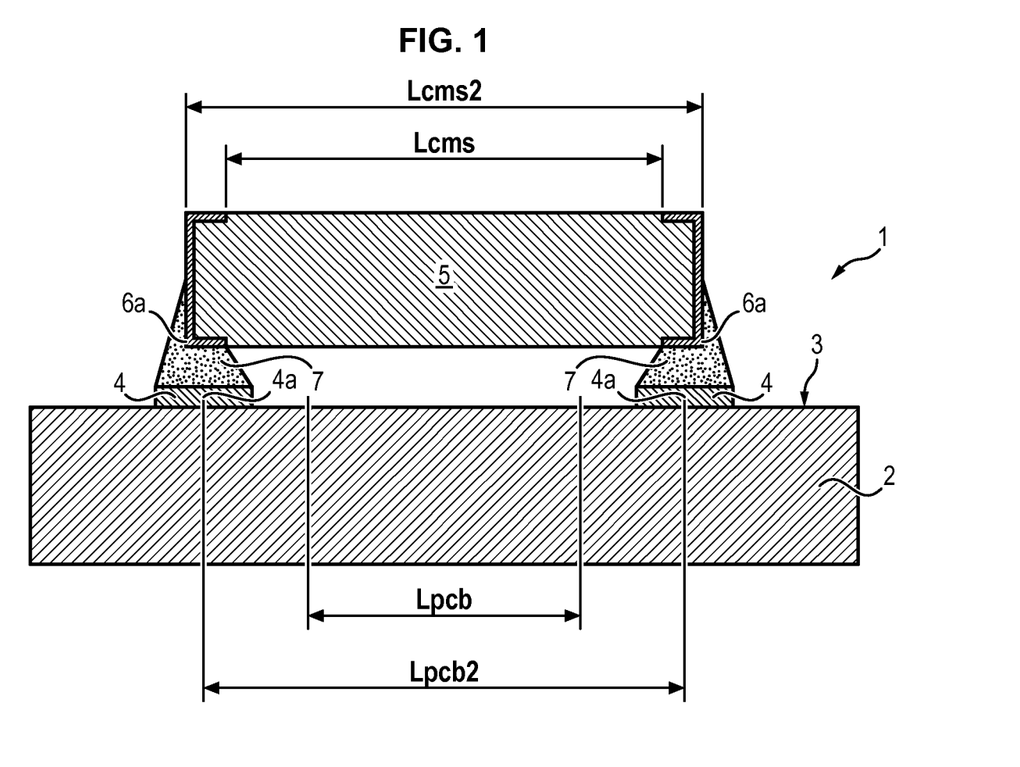
FIG. 1 illustrates schematically an exemplary embodiment of an electronic board conforming to the prior art.
Figure 2A:
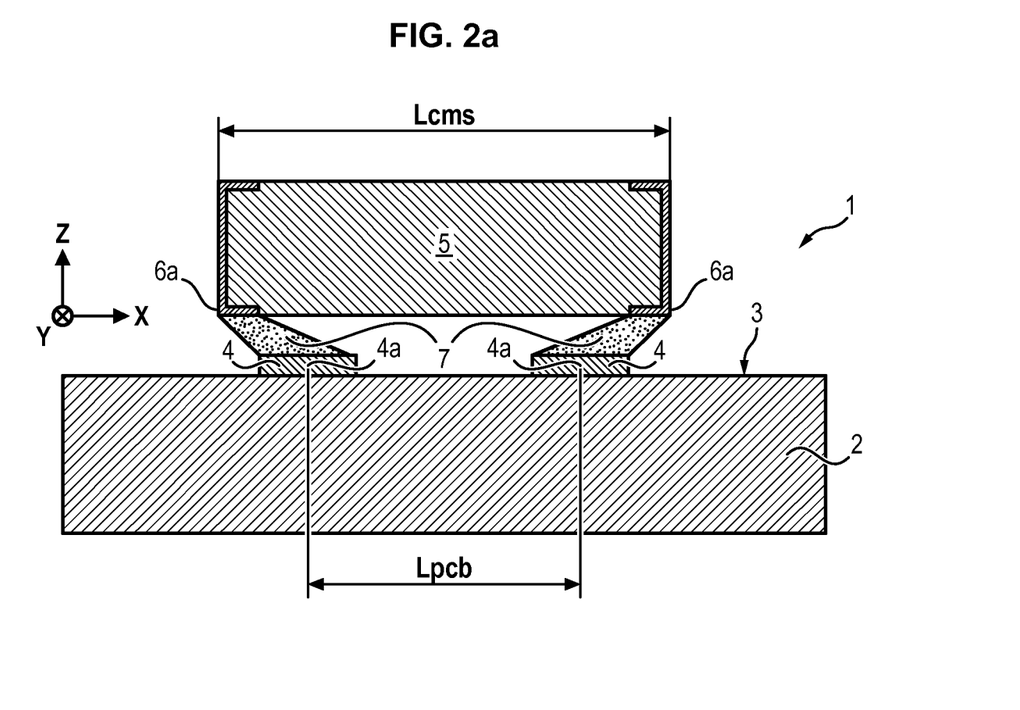
FIG. 2a is a schematic view of a first exemplary embodiment of an electronic board conforming to the invention comprising a surface-mount component, in the case where the first distance is less than the second distance. The electronic board is at ambient temperature.
Figure 2B:
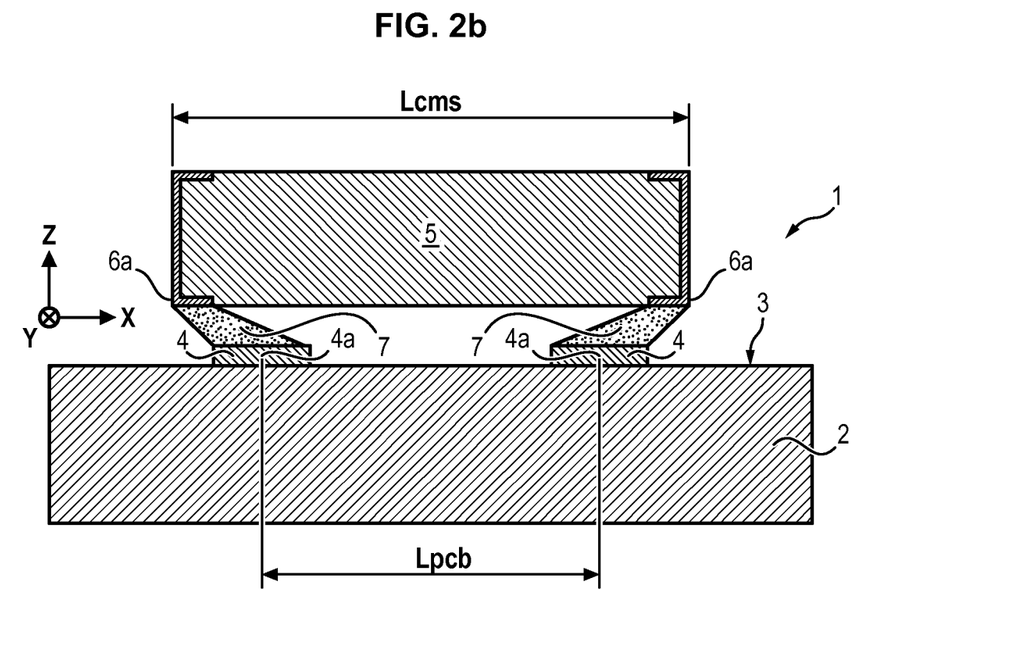
FIG. 2b illustrates the electronic board when it is subjected to a extreme temperature.

The joints thus obtained (whether by soldering or by sintering) are however subjected to significant stresses. In particular, the portion of the joints which is positioned between the component and the solder pad is very thin, as can be seen in FIG. 1. The joints are therefore subjected to very strong stresses, particularly in shear, and therefore risk cracking rapidly when the electronic board undergoes extreme environments of temperature and/or vibration. This therefore reduces sharply the lifetime of the electronic board.

Moreover, in use, the electronic boards can be subjected to extreme temperature environments creating relative displacements (in the plane of the surface) between the SMCs and the printed circuit. These relative displacements are generally due to a differential expansion between the SMCs and the printed circuit, resulting from a variation of temperature, the SMCs and the printed circuit generally having different thermal expansion coefficients in the plane. Yet these relative displacements have the effect of generating stresses which damage the solder joints, thus limiting their lifetime and their reliability.

In order to reduce these stresses, it has been proposed to increase the vertical height (usually designated by the term "standoff") between the upper face of the solder pad (which can be of copper, of copper covered with nickel-gold or of any other suitable material) and the lower point of the conductive terminals of the SMCs once soldered, in order to increase the height of the alloy at the interface between the SMCs and the solder pads. The solder joints thus obtained are then more flexible and therefore more robust.

However, the aeronautics and space industry keeps constantly searching for improvements in electronic boards, and therefore is still searching for inventions to improve the reliability and the lifetime of SMC solder joints.

SUMMARY OF THE INVENTION

One objective of the invention is therefore to propose an electronic board comprising a printed circuit and surface-mount components having improves lifetime, reliability and toughness, which is easy to produce and has moderate cost regardless of the density of components installed on the printed circuit and/or the type of component, without however impacting the assembly efficiency of the electronic board and without modifying the assembly method usually used.

To this end, the invention proposes an electronic board comprising:

a printed circuit having a connection face defining a plane including two solder or sintering pads, said pads being separated by a first distance when the electronic board is at ambient temperature, the printed circuit having a first thermal expansion coefficient in the plane, an electronic component including at least one terminal, each terminal being soldered or sintered on an associated pad by means of a solder or sintered joint, the electronic component comprising two terminals, said terminals being separated by a second distance when the electronic board is at ambient temperature, the electronic component having a second thermal expansion coefficient in the plane, the solder joint having a third thermal expansion coefficient in the plane, the electronic board is characterized in that the first distance is substantially equal to the quotient of the difference between the first thermal expansion coefficient and the third thermal expansion coefficient and of the difference between the second thermal expansion coefficient and the third thermal expansion coefficient, all multiplied by the second distance:

$$L_{PCB} = L_{CMS} \times \frac{CTE_{SMC} - CTE_J}{CTE_{PCB} - CTE_J}$$

so that an orthogonal projection of the terminal of the electronic component on the connection face of the printed circuit does not overlap the associated pad.

Certain preferred but non-limiting features of the electronic board described above are the following, taken individually or in combination:

the pad extends under the electronic component or on the side of the electronic component.

the electronic board also comprises an insulating layer covering at least partially the connection face, at least one cavity formed in the insulating layer and exposing at least partially the pad, the electronic component being in contact or at a distance from the insulating layer and the terminal of the electronic component being joined to the corresponding pad through the cavity.

the printed circuit comprises at least two pads and the electronic component comprises at least two terminals associated with said pads, the printed circuit also comprising at least four conductive layers separated two by two by insulating layers, including a first skin conductive layer joined to the insulating layer, a first and a second internal conductive layers comprising the two pads, and at least two cavities formed in the first skin conductive layer and in the insulating layer.

the wall of the cavity is substantially perpendicular to the pad.

the electronic board also comprises an adhesive point under the electronic component, between the pads, in order to retain the electronic component in position relative to the pads during soldering of the electronic component to the printed circuit.

the electronic board also comprises, for each terminal, a sacrificial pad, said sacrificial pad extending between the pad and a portion of the printed circuit which extends facing the terminal.

the sacrificial pad has a dimension, in a direction corresponding to a direction of greater expansion of the electronic component, equal to at least 200 microns.

the electronic board also comprises a connection strip configured to connect electrically the sacrificial pad and the associated pad.

the sacrificial pad, the pad and the connection strip form an H, a U or an O.

BRIEF DESCRIPTION OF THE DRAWINGS

Other features, aims and advantages of the present invention will appear more clearly upon reading the detailed description which follows, and with reference to the appended drawings, given by way of non-limiting examples and in which.

DETAILED DESCRIPTION OF ONE EMBODIMENT

An electronic board 1 comprises a printed circuit 2 including conductive layers separated by insulating layers on which are mounted surface-mount electronic components 5 (hereafter SMCs 5).

Generally, a printed circuit 2 can be of the one-layer type (also called single layer) and comprise only a single conductive layer over an insulating layer, double layer (also called double face) and comprise a conductive layer on either side of an insulating layer or multi-layer and comprise at least four conductive layers (and therefore three insulating layers).

The printed circuit 2 has a connection face 3 defining a plane (X, Y) and intended to receive at least one SMC 5. To this end, the connection face 3 includes at least one pad 4. What is meant here by pad 4 is a pad, of copper for example, on which the SMC 5 is soldered or sintered.

The SMCs 5, for their part, comprise at least one terminal 6, each terminal being joined to an associated pad 4 of the connection face 3 of the printed circuit 2 by means of a solder joint 7.

Hereafter, the invention will be described in the case where the printed circuit 2 of the electronic board 1 comprises two solder pads 4, two solder joints 7 and one SMC 5 comprising two terminals 6. This, however, is not limiting; the printed circuit can comprise a greater number of solder pads 4, or can be obtained by sintering and then include sintering pads 4 and as many associated sintering joints 7, the electronic board 1 being able to comprise a greater number of SMCs 5, and the SMCs 5 a different number of terminal (at least one terminal 6). The invention then applies mutatis mutandis to each assembly formed from (solder or sintering) pads 4 and the associated SMC 5.

The invention also applies mutatis mutandis to sintering or soldering a chip to a substrate in a surface-mount component, because said chips themselves form a surface-mount component on a printed circuit.

In order to improve the lifetime of the electronic board 1 and to reduce the stresses in the solder joints 7, the solder pad(s) 4 are positioned on the connection face 3 of the printed circuit 10 so that an orthogonal projection of the terminals 6 of the electronic component 5 on the connection face 3 of the printed circuit does not overlap the associated solder pad(s) 4. In other words, the solder pads 4 and the terminals 6 do not overlap, so that the solder pads 4 are located under the SMC 5 or on either side of the SMC 5.

This therefore allows eliminating the zone of the solder joint 7 which is positioned between a given terminal 6 of the SMC 5 and the associated solder pad 4. As we have seen above, this very thin zone (on the order of ten microns) corresponded in fact to the location of the solder joint 7 where the shear stresses (and therefore the risks of cracking)

are greatest in an SMC mounted to the printed circuit in accordance with the prior art (see FIG. 1). Yet by eliminating this zone, the shear stresses in the solder joint 7 are homogenized and the risks of cracking are limited, which further improves the lifetime of the SMC assembly.

In the case where the printed circuit 10 and the SMC 5 have different thermal expansion coefficients in the plane (X, Y), the distance between the solder pads 4 can also be adjusted depending on the distance between the terminals 6 of the SMC and the value of these thermal expansion coefficients so as to optimize their relative displacement during the exposure of the electronic board 1 to extreme temperature conditions and to relieve the solder joints 7.

In fact, the solder pads 4 of the printed circuit are separated by a first distance $L_{PCB}$. This first distance $L_{PCB}$ is measured at ambient temperature $T_1$ between the respective centers 4a of the solder pads 4.

The terminals 6, for their part, are separated by a second distance $L_{CMS}$. This second distance $L_{CMS}$ is measured at ambient temperature $T_1$ between the respective ends 6a of the terminals 6. In the case where the SMC 5 comprises more than two terminals 6, the second distance $L_{CMS}$ corresponds to the distance between the ends 6a of the most distant terminals 6, typically diagonally. Moreover, for the SMCs 5 whose terminals comprise tabs, the distance $L_{CMS}$ extends from the free end of the tabs which faces the solder pads 4 and not from their end joined to the SMC.

Finally, the solder joints 7 have a cumulative thickness $L_J$ measured at ambient temperature $T_1$ between their free edges. In the case where the SMC 5 comprises more than two terminals 6, the thickness $L_J$ corresponds to the cumulative thickness of the solder joints 7 between the ends 6a of the most distant terminals 6, typically diagonally on the SMC 5.

The expansion $\Delta L_{PCB}$ of the printed circuit 2, the expansion $\Delta L_{CMS}$ of the SMC 5 and the expansions $\Delta L_J$ as functions of temperature (these expansions $\Delta L_{PCB}$, $\Delta L_{CMS}$ and $\Delta L_J$ being able to be positive and/or negative) can be evaluated thanks to the following relations:

$$\Delta L_{CMS} = L_{CMS} \times \Delta T \times CTE_{SMC}$$

$$\Delta L_{PCB} = L_{PCB} \times \Delta T \times CTE_{PCB}$$

$$\Delta L_J = L_J \times \Delta T \times CTE_J$$

where $L_{PCB}$ is the first distance $L_{CMS}$ is the second distance $L_J$ is the cumulative thickness of the solder joints 7

$\Delta T = T_2 - T_1$ $T_1$ is the ambient temperature at which the first and second distances $L_{PCB}$, $L_{CMS}$ are determined. What is meant here by ambient temperature $T_1$ is a temperature on the order of twenty degrees.

$T_2$ is a different temperature from $T_1$, for example a utilization, storage or operating temperature of the electronic board 1, $\Delta L_{CMS}$ is the expansion of the SMC 5 between the ambient temperature $T_1$ and the temperature $T_2$, $\Delta L_{PCB}$ is the expansion of the printed circuit 2 between the ambient temperature $T_1$ and the temperature $T_2$, $\Delta L_J$ is the expansion of the solder joints 7 between the ambient temperature $T_1$ and the temperature $T_2$.

The difference $\Delta L_{assembly}$ between the expansion of the SMC 5 and the expansion of the printed circuit 2, between the ambient temperature $T_1$ and the temperature $T_2$, can therefore be obtained thanks to the following formula (1):

$$\Delta L_{assembly} = (L_{PCB} \times CTE_{PCB} - L_{CMS} \times CTE_{SMC} - L_J \times CTE_J) \times \Delta T$$

Moreover, the distance $L_{PCB}$ is equal to the sum of the distance $L_{CMS}$ and the cumulative thickness $L_J$ of the solder joints 7. The following formula (2) is therefore obtained:

$$\Delta L_{assembly} = (L_{PCB}(CTE_{PCB} - CTE_J) - L_{CMS}(CTE_{SMC} + CTE_J)) \times \Delta T$$

It is thus possible to simply and effectively increase the lifetime and the toughness of an electronic board 1 by adjusting the first distance $L_{PCB}$ depending on the second distance $L_{CMS}$ and the thermal expansion coefficients $CTE_{PCB}$, $CTE_J$ and $CTE_{SMC}$, thanks to the formula (1) reproduced above. Regardless of the operating temperature, the difference in expansion $\Delta L_{assembly}$ is therefore optimized so as to be as small as possible, thus strongly limiting the stresses within the solder joints 7.

The second distance $L_{CMS}$ being fixed and intrinsic to the SMC 5, the first distance $L_{PCB}$ is therefore adjusted by engraving the solder pads 4 on the connection face 3 so that the first distance $L_{PCB}$ allows compensating the difference in the thermal expansion coefficient between the printed circuit 2, the solder joints 7 and the SMC 5.

Ideally, a zero difference in expansion $\Delta L_{assembly}$ is sought. In order to reduce the stresses formed within the solder joints 7 during variations in temperature, the first distance $L_{PCB}$ (between the solder pads 4) is therefore selected so as to be equal to the quotient of, on the one hand, the difference between the thermal expansion coefficient of the SMC ($CTE_{SMC}$) and the thermal expansion coefficient of the solder joints and, on the other hand, the difference between the thermal expansion coefficient of the printed circuit board ($CTE_{PCB}$) and the thermal expansion coefficient of the solder joints, all multiplied by the second distance $L_{CMS}$:

$$L_{PCB} = L_{CMS} \times \frac{CTE_{SMC} - CTE_J}{CTE_{PCB} - CTE_J} \qquad (3)$$

It will be noted that the invention finds application particularly when the difference between the first thermal expansion coefficient ($CTE_{PCB}$) and the second thermal expansion coefficient ($CTE_{SMC}$) is greater than or equal to 2. Outside this range, the differential expansion of the SMC 5 and of the printed circuit is in fact too low for the relative displacement of the SMC 5 and of the printed circuit to be noticeable.

Figure 3:
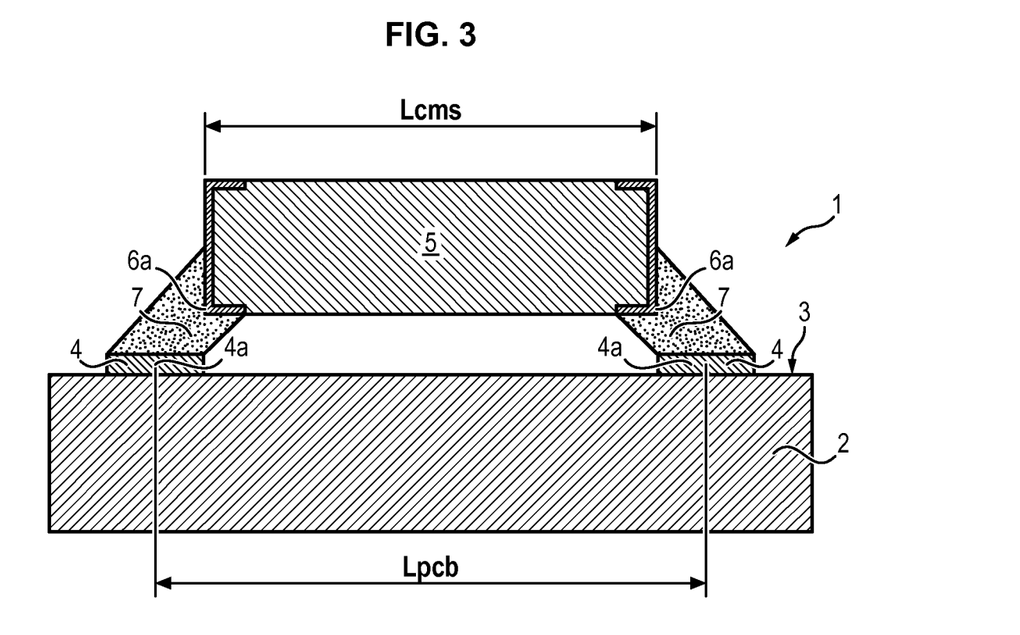
FIG. 3 is a schematic view of a second exemplary embodiment of an electronic board conforming to the invention, comprising a surface-mount component, in the case where the first distance is greater than the second distance.

Thus, when the thermal expansion coefficient $CTE_{SMC}$ of the SMC 5 is less than the thermal expansion coefficient $CTE_{PCB}$ of the printed circuit 2, which itself is less than the thermal expansion coefficient $CTE_{joint}$ of the joint 7 (case of the great majority of SMCs 5), it is discovered that the first distance $L_{PCB}$ is strictly greater than the second distance $L_{CMS}$ (FIG. 3) so that the solder pads 4 are located on either side outside the terminals 6 of the SMC 5. In this manner, when the electronic board 1 undergoes a temperature $T_2$ greater than the ambient temperature $T_1$, the SMC 5 and the printed circuit 2 dilate. However, the thermal expansion coefficient $CTE_{PCB}$ of the material constituting the printed circuit 2 being greater than that of the SMC 5, the printed circuit 2 dilates more than the SMC 5. The distance $L_{PCB}$ being strictly greater than the second distance $L_{CMS}$, the result is that at this temperature $T_2$, the solder pads 4 and the terminals 6 of the SMC 5 are essentially at the same relative distance as at ambient temperature $T_1$, which relieve the stresses in the solder joints 7 relative to the case where the solder pads 4 and the terminals 6 of the SMC 5 are facing one another at ambient temperature $T_1$ (FIG. 1) and the relative distance between them varies more substantially.

Thus raising the temperature does not modify the relative displacement between the terminals 6 of the SMC 5 and the solder pads 4 of the printed circuit 2 and reduces its negative effects by compensating the difference in expansion of the SMC 5, of the joints 7 and of the printed circuit 2.

In practice, the lifetime and the toughness of the electronic board 1 are already considerably improved when the first distance $L_{PCB}$ is equal, within 50%, to the multiplication of the quotient of the differences in thermal expansion coefficients $$\frac{CTE_{SMC} - CTE_J}{CTE_{PCB} - CTE_J}$$

by the second distance $L_{CMS}$ (formula (3) described above), as long as the orthogonal projection of the terminals 6 does not overlap the associated solder pad 4. This tolerance of 50% is justified by the following observations:

The terminal of the SMC 5 (respectively, the printed circuit 2) has a variable expansion $\Delta L_{CMS}$ (respectively, $\Delta L_{PCB}$) between its two ends (respectively between the edges of the solder pad 4). It is therefore not possible to obtain $$L_{PCB} = L_{CMS} \times \frac{CTE_{SMC} - CTE_J}{CTE_{PCB} - CTE_J}$$

everywhere in the solder joint.

It is not always possible to bring the solder pads 4 sufficiently close together to satisfy the formula (3). For example, if the thermal expansion coefficient of the SMC 5 is twice higher than that of the printed circuit 2, it is not possible to bring the pads sufficiently close together to satisfy the formula (3) and produce the solder joint during manufacture of the electronic board 1.

The thermal expansion coefficients of the printed circuit, of the solder joints 7 and of the SMC are generally not known with accuracy and have a dispersion.

The thermal expansion coefficients of the printed circuit, of the solder joints 7 and of the SMC vary depending on the temperature.

For example, for single-face printed circuits 2, the thermal expansion coefficient $CTE_{PCB}$ of the printed circuit 2 is generally comprised between 14 ppm/° C. and 17 ppm/° C. In the example below, the printed circuit 2 has a thermal expansion coefficient $CTE_{PCB}$ equal to 14 ppm/° C. The solder joint 7 is produced with a leadless alloy SAC305, the thermal expansion coefficient $CTE_J$ of which is 23.5 ppm/° C. The SMC 5 is a 2512 resistor with a length of 6.3 mm so that the second distance $L_{CMS}$, which corresponds to the distance between the ends 6a of the terminals 6 of the resistor, is equal to 6.3 mm at ambient temperature. Moreover, the thermal expansion coefficient $CTE_{SMC}$ of the resistor is equal to 7. It is therefore attempted to separate the solder pads 4 so that the second distance $L_{CMS}$, which corresponds to the distance between the centers of the solder pads 4, approaches the theoretical value that is obtained thanks to formula (3), or approximately 10.9 mm:

$$L_{PCB} = 6.3 \times \frac{7 - 23.5}{14 - 23.5} = 10.9 \text{ mm}$$

In one embodiment, the electronic board 1 can also comprise an insulating layer 8 covering at least partially the connection face 3 and two cavities 9, formed in the insulating layer and exposing at least partially the solder pads 4. In this case, the SMC 5 is in contact with or at a distance from the insulating layer 8 and its terminals 6 are joined to the corresponding soldering pads 4 through the first and second cavities 9.

An embodiment of this type is described more particularly in French patent application no. 17 56700, filed on 13 Jul. 2017 in the name of the Applicant. The production of cavities 9 of this type allows simply increasing at low cost the standoff of the SMC 5 without, however, impacting the assembly efficiency of the SMC 5.

In one variant of this embodiment (FIG. 4), the electronic board 1 is multi-layer and comprises at least four conductive layers separated, two by two, by insulating layers, including:
a first skin conductive layer joined to the insulating layer,
a first and a second internal conductive layers comprising two solder pads 4.

Figure 4:
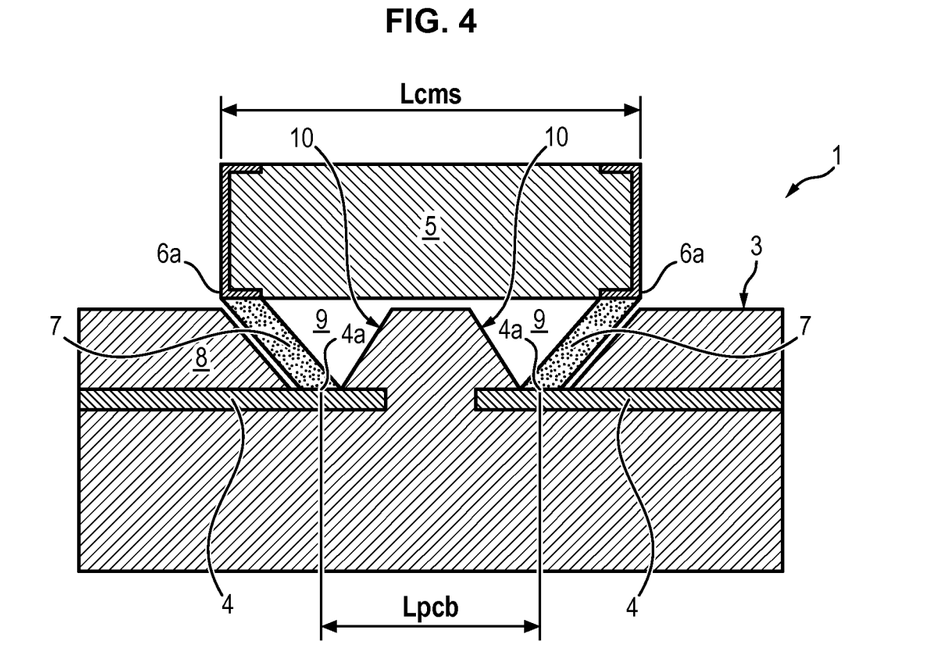
FIG. 4 is a schematic view of a third exemplary embodiment of an electronic board conforming to the invention, in which the cavities are formed in an insulating layer covering all or a portion of the connection face of the insulating board and the first distance is less than the second distance.

The two cavities 9 are then formed in the first skin conductive layer and in the insulating layer.

French patent application no. 17 56679 in particular can be referred to, filed on 13 Jul. 2017 in the Applicant's name. An electronic board 1 of this type can thus comprise various SMCs 5, whether fine-pitch components, large size components, with seagull tabs, etc., simply and at moderate cost without, however, impacting the assembly efficiency of the SMCs 5.

Regardless of the variant embodiment, the wall 10 of the cavities 9 can be inclined relative to the connection face 3. As a variant, it can diverge. According to yet another variant the wall 10 of the cavities 9 is perpendicular to the connection face 3. In this last variant embodiment, the exposed surface of the connection face 3 is therefore larger than the surface of the solder pads 4. If applicable, the cavity 9 can be larger in the principal direction of expansion of the SMC 5 than the solder pad 4. To this end, the insulating layer can be pre-drilled before its assembly with the printed circuit 2. As a variant, the solder pad 4 can be produced so as to be larger than necessary in this direction, then the cavity 9 can be produced by surface photolithography as described in document FR 17 56700 and the superfluous zone of the solder pad 4 can be withdrawn.

During automatic joining, particularly by reflow, of an SMC 5 on a printed circuit 2, it may happen that the SMC 5 is not centered and moves more toward one of the terminals 6 due to wetting forces which are generally not balanced (the SMC 5 generally not being placed exactly in the middle of the two pads of solder paste).

In the event of displacement of the SMC 5, the desired effect is then not obtained: typically, this displacement can re-create a zone of strong stresses in the solder joint 7 vertically between a given terminal 6 of the SMC 5 and the associated solder pad 4, which is conducive to the initiation of cracks and therefore reduces the lifetime of the SMC. Worse still, the SMC 5 can separate from one of the terminals 6 during soldering.

Two embodiments are proposed to facilitate the automatic manufacture of electronic boards 2. This problem does not occur, in fact, during manual joining of the SMC 5.

In a first embodiment (FIG. 5), an adhesive point 11 is placed between the SMC 5 and the solder pads 4 of the printed circuit 2 prior to the soldering step. In fact, one adhesive point 11 of this type is sufficient to retain the SMC 5 in position and oppose the wetting forces.

Figure 5:
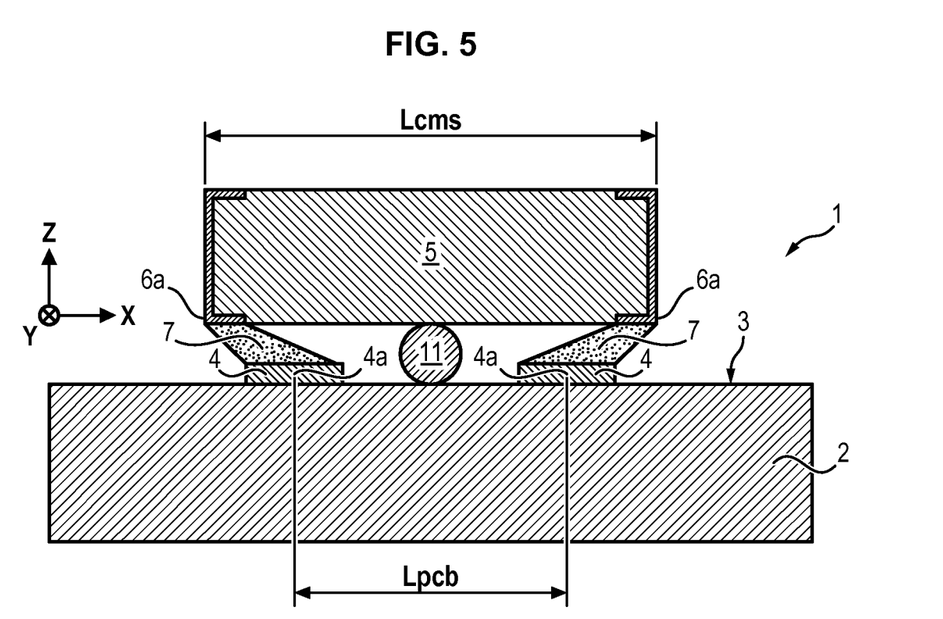
FIG. 5 illustrates a fourth embodiment of an electronic board conforming to the invention, in which an adhesive point is used to retain the electronic component during its soldering to the printed circuit.
Figure 6A:
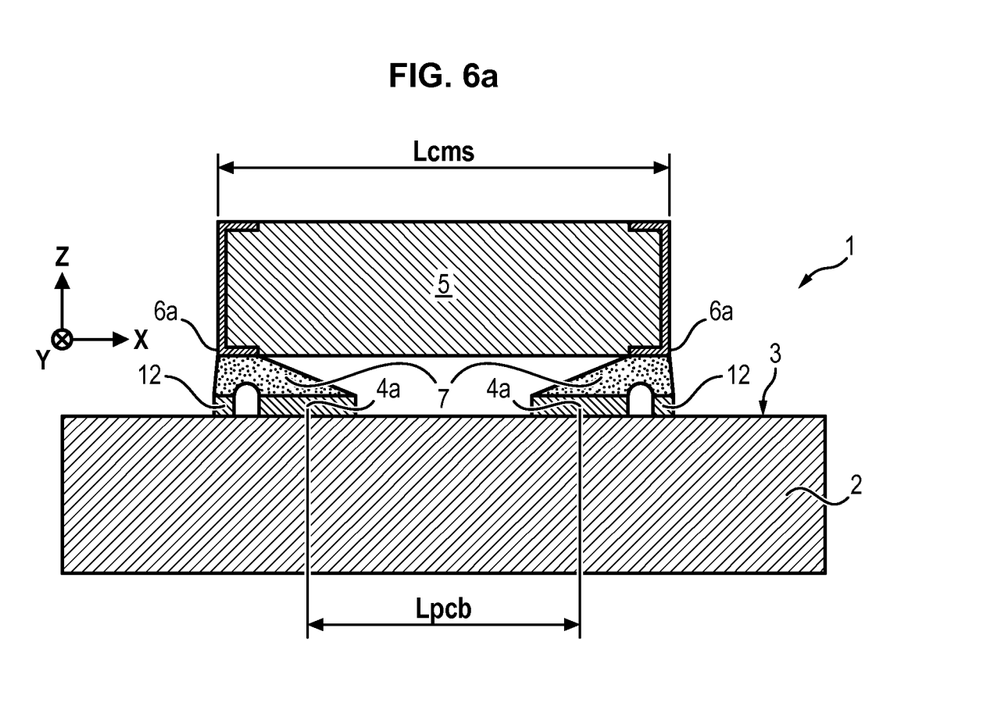
FIGS. 6a and 6b illustrate two exemplary embodiments of a fifth embodiment conforming to the invention, in which the electronic component is also joined to sacrificial solder pads.
Figure 6B:
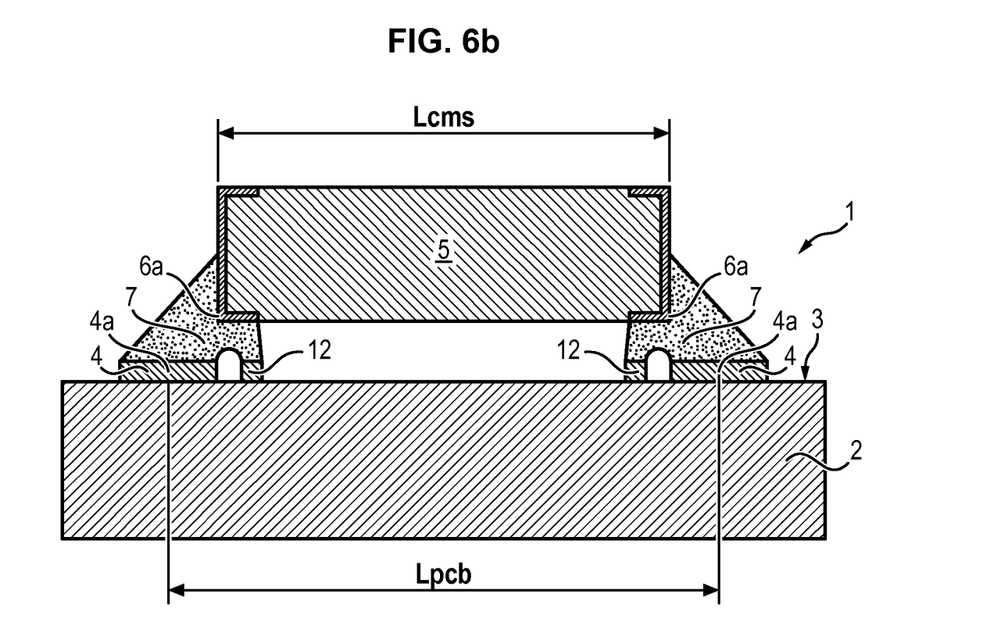
Figure 7A:
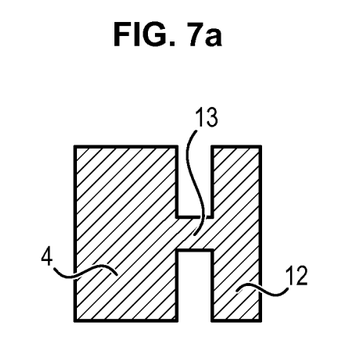
FIGS. 7a and 7b are schematic top-views illustrating a variant embodiment of the fifth embodiment, in which the sacrificial solder pads are connected to the solder pads by means of one or of two connection strips.
Figure 7B:
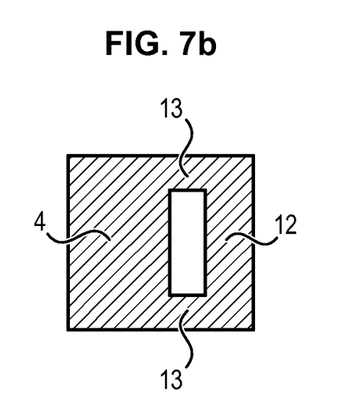

Typically, the adhesive 11 is selected so as to have a polymerization temperature lower than the heat treatment temperature used during soldering of the SMC 5. For example, when the SMC 5 is soldered by reflow of a solder paste, the adhesive is selected so as to have a polymerization temperature on the order of 100° C. to 150° C. (recall that soldering by reflow comprises, in a manner known per se, the successive steps of temperature rise, preheating, reflow and cooling, the temperature of the reflow step being generally higher than 180° C.). In this manner, the adhesive polymerizes during the preheating phase and is capable of retaining the SMC 5 in position during the reflow step.

The adhesive can for example be an epoxy adhesive.

In a second embodiment (FIGS. 6a, 6b, 7a and 7b), a sacrificial solder pad 12 is added, for each terminal 6 of the SMC 5, between the solder pad 4 and the portion of the printed circuit 2 which extends facing the associated terminal 6. The sacrificial pad 12 can be produced in the same material as the associated solder pad 4. Thus, the sacrificial pads 12 can be placed on the outside of the solder pads 4 when the solder pads 4 are located under the SMC 5, or between the solder pads 4 when the solder pads 4 are located on the outside of the SMC 5.

Preferably, the sacrificial solder pads 12 are very thin (for example on the order of two hundred microns) so as to retain the advantage linked to the offset of the solder pads 4 relative to the center of the terminals 6. When the electronic board 2 undergoes an extreme thermal environment, the shear stresses will then be concentrated in the portion of the solder joint 7 which is joined to the sacrificial pads 12, and will generally crack them. However, these sacrificial pads 12 being distinct from the solder pads 4, the cracking will not affect the portion of the solder joint 7 which is joined to the solder pads 4. We will therefore find an electronic board 1 in which the orthogonal projection of the terminals 6 does not overlap the solder pads 4. In parallel, the sacrificial pads 12 are capable of retaining the SMC 5 in position and avoiding having it offset itself during its soldering to the printed circuit board 2.

The Applicant observed that, in very rare cases, the SMC 5 could move anyway and then be joined at only one of its terminals 6 to one of the sacrificial pads 12. In order to further reduce reject rates, for each terminal 6, the sacrificial pad 12 and the associated solder pad 4 can be produced by a thin strip 13 produced from the same material as the solder pad 4. Untimely displacements of the SMC 5 and of the solder joint 5 during soldering of the SMC 5 to the printed circuit are then rarer. In the event of an untimely displacement of the SMC 5 and of the solder joint 5 during soldering of the SMC 5 to the printed circuit so that the solder joint 7 is no longer in contact other than with the sacrificial pad 12, the electrical connection with the solder pad 4 remains assured thanks to the thin strip 13. The thin strip 13 can be centered overall between the sacrificial pad 12 and the solder pad 4 (thus forming an H—FIG. 6a), or extend along one of their edges (thus forming a U). As a variant, two strips 13 can extend between the sacrificial pad 12 and the solder pad 4, for example at each of the edges of the solder pad 4 (thus forming an O—FIG. 6b).

It will be noted that the shape and the dimensions of the sacrificial solder pad 12 are not limiting. In particular, the sacrificial solder pad 12 can be longer or shorter than the solder pad 7, wider or narrower, without this being limiting.

The invention claimed is:

1. An electronic board comprising:
   a printed circuit having a connection face defining a plane including two, the two pads being separated by a first distance when the electronic board is at ambient temperature, and
   an electronic component including two terminal, each terminal being soldered or sintered on an associated pad of the two pads by means of a solder or sintering joint, the two terminals being separated by a second distance when the electronic board is at ambient temperature,
   wherein the printed circuit having a first thermal expansion coefficient ($CTE_{PCB}$) in the plane, the electronic component has a second thermal expansion coefficient ($CTE_{SMC}$) in the plane and the solder joint having a third thermal expansion coefficient ($CTE_J$) in the plane, and
   wherein the first distance ($L_{PCB}$) is substantially equal to a quotient of a difference between the first thermal expansion coefficient ($CTE_{SMC}$) and the third thermal expansion coefficient ($CTE_J$) and of a difference between the second thermal expansion coefficient ($CTE_{PCB}$) and the third thermal expansion coefficient ($CTE_J$), all multiplied by the second distance ($L_{CMS}$):

$$L_{PCB} = L_{CMS} \times \frac{CTE_{SMC} - CTE_J}{CTE_{PCB} - CTE_J},$$

so that orthogonal projections of the two terminals of the electronic component on the connection face of the printed circuit do not overlap the associated pads of the two pads.

2. The electronic board according to claim 1, wherein the pad extends under the electronic component or on a side of the electronic component.

3. An electronic board according to claim 1, further comprising:
   an insulating layer covering at least partially the connection face, and
   a cavity formed in the insulating layer and exposing at least partially one of the two pads,
   the electronic component being in contact or at a distance from the insulating layer and the terminal of the electronic component being joined to the at one of the two pads through the cavity.

4. The electronic board according to claim 3, wherein the printed circuit further comprises:
   a first skin conductive layer joined to the insulating layer,
   a first and a second internal conductive layers comprising the two pads, and
   an additional cavity formed in the first skin conductive layer and in the insulating layer.

5. The electronic board according to claim 3, wherein a wall of the cavity is substantially perpendicular to the one of the two pads.

6. An electronic board according to claim 1, further comprising an adhesive point under the electronic component, between the two pads, in order to retain the electronic component in position relative to the two pads during soldering of the electronic component to the printed circuit.

7. The electronic board according to claim 1, further comprising, for each of the two terminal, a sacrificial pad extending between a corresponding pad of the two pads and a portion of the printed circuit which faces the terminal.

8. The electronic board according to claim 7, wherein the sacrificial pads have a dimension, in a direction corresponding to a direction of greater expansion of the electronic component, equal to at least 200 microns.

9. The electronic board according to claim 7, further comprising a connection strip configured to electrically connect the sacrificial pads and the corresponding pad of the two pads.

10. The electronic board according to claim 9, wherein the connection strip is centered between the sacrificial pad and the corresponding pad of the two pads, or extends between two opposite ends of the sacrificial pad and the corresponding pad of the two pads.

11. The electronic board according to claim 9, further comprising an additional connection strip, wherein the connection strip and the additional connection strip extend from opposite ends of the sacrificial pad and the corresponding pad of the two pads.

\* \* \* \* \*